(12) United States Patent
Hold et al.

(10) Patent No.: US 9,105,315 B2
(45) Date of Patent: Aug. 11, 2015

(54) CONTROLLING THE VOLTAGE LEVEL ON THE WORD LINE TO MAINTAIN PERFORMANCE AND REDUCE ACCESS DISTURBS

(75) Inventors: Betina Hold, El Dorado Hills, CA (US); Kenza Charafeddine, Grenoble (FR); Yves Thomas Laplanche, Crolles (FR)

(73) Assignee: ARM Limited, Cambridge (GB)

( * ) Notice: Subject to any disclaimer, the term of this patent is extended or adjusted under 35 U.S.C. 154(b) by 442 days.

(21) Appl. No.: 13/555,255

(22) Filed: Jul. 23, 2012

(65) Prior Publication Data

US 2014/0022835 A1    Jan. 23, 2014

(51) Int. Cl.
*G11C 11/00* (2006.01)
*G11C 8/08* (2006.01)
*G11C 11/413* (2006.01)

(52) U.S. Cl.
CPC .............. *G11C 8/08* (2013.01); *G11C 11/413* (2013.01)

(58) Field of Classification Search
CPC .............................. G11C 8/08; G11C 11/413
USPC .................................. 365/154, 194, 189.011
See application file for complete search history.

(56) References Cited

U.S. PATENT DOCUMENTS

| | | |
|---|---|---|
| 2003/0052725 A1 | 3/2003 | Kamata |
| 2010/0142253 A1 | 6/2010 | Katayama |
| 2011/0149674 A1 | 6/2011 | Yeung et al. |
| 2012/0170390 A1* | 7/2012 | Idgunji et al. ................. 365/194 |
| 2013/0272056 A1 | 10/2013 | Liaw |

FOREIGN PATENT DOCUMENTS

| | | |
|---|---|---|
| EP | 0 023 655 | 2/1981 |
| JP | 60-226095 | 11/1985 |
| JP | 4-057297 | 2/1992 |

OTHER PUBLICATIONS

Jung et al., "Design Techniques for Improving SRAM Cell Stability in Advanced Technology", *Dept. of EECS*, University of California at Berkeley, No Date, 4 pgs.
Mann et al., "Impact of circuit assist methods on margin and performance in 6T SRAM", *Solid-State Electronics*, vol. 54, 2010, pp. 1398-1407.
Moradi et al., "Multi-Level Wordline Driver for Low Power SRAMs in Nano-Scale CMOS Technology", *IEEE*, 2011, pp. 326-331.
(Continued)

*Primary Examiner* — Richard Elms
*Assistant Examiner* — Mohammed A Bashar
(74) *Attorney, Agent, or Firm* — Pramudji Law Group PLLC; Ari Pramudji

(57) ABSTRACT

A semiconductor memory storage device for storing data including: a plurality of storage cells, each storage cell including an access control device configured to provide the storage cell with access to or isolation from a data access port in response to an access control signal. Access control circuitry includes: access switching circuitry configured to connect a selected access control line to a voltage source; and feedback circuitry configured to feedback a change in voltage on the access control line to the access switching circuitry. The access control circuitry is configured to respond to a data access request signal to access a selected storage cell connected to a corresponding selected access control line in response to the feedback circuitry providing a feedback signal indicating that the access control line voltage has attained a predetermined value.

17 Claims, 9 Drawing Sheets

(56) References Cited

OTHER PUBLICATIONS

Khellah et al., "Read and Write Circuit Assist Techniques for Improving Vccmin of Dense 6T SRAM Cell", *IEEE*, 2008, 4 pgs.

Chuang et al., "High-Performance SRAM in Nanoscale CMOS: Design Challenges and Techniques", *IEEE*, 2007, pp. 4-12.

Vatajelu et al., "Supply Voltage Reduction in SRAMs: Impact on Static Noise Margins", *IEEE*, 2008, 6 pgs.

S. Ohbayashi et al, "A 65-nm SoC Embedded 6T-SRAM Designed for Manufacturing With Read and Write Operation Stabilizing Circuits" *IEEE Journal of Solid-State Circuits*, vol. 42, No. 4, Apr. 2007, pp. 820-829.

H. Pilo et al, "An SRAM Design in 65nm and 45nm Technology Nodes Featuring Read and Write-Assist Circuits to Expand Operating Voltage" *2006 Symposium on VLSI Circuits Digest of Technical Papers*, 2006.

M. Yabuuchi et al, "A 45nm 0.6V Cross-Point 8T SRAM with Negative Biased Read/Write Assist" *2009 Symposium on VLSI Circuits Digest of Technical Papers*, 2009, pp. 158-159.

M.H. Abu-Rahma et al, "A Robust Single Supply Voltage SRAM Read Assist Technique Using Selective Precharge" IEEE, 2008, pp. 234-237.

M. Khellah et al, "Wordline & Bitline Pulsing Schemes for Improving SRAM Cell Stability in Low-Vcc 65nm COS Designs" *2006 Symposium on VLSI Circuits Digest of Technical Papers*, 2006.

K. Takeda et al, "Multi-step Word-line Control Technology in Hierarchical Cell Architecture for Scaled-down High-density SRAMs".

GB Search Report issued May 19, 2014 in GB 1320034.0.

\* cited by examiner

CONTROLLING THE VOLTAGE LEVEL ON THE WORD LINE TO MAINTAIN PERFORMANCE AND REDUCE ACCESS DISTURBS

TECHNICAL FIELD

The field of the invention relates to the field of data storage and in particular, to the storage and access of data in semiconductor memories.

BACKGROUND

With ever increasing demands to reduce both the size of devices and their power consumption, it is becoming increasingly challenging to design robust semiconductor memories such as SRAM. As technology scales down the SRAM bitcell is losing margin in both the read and write operations due to variations in threshold voltages of the tiny devices used in the bit cell.

Each storage cell in an SRAM comprises a feedback loop for holding a data value. In order to write to the feedback loop and store a new value, the input data value must have a high enough voltage level to be able to switch the state stored by the feedback loop if required, while reading from the feedback loop should be performed without disturbing the values stored in any of the feedback loops. When reading from a cell both bit lines are pre-charged and the side of the cell storing a 0 will pull down the bit line it is connected to and this change in voltage level can be detected to determine where the 0 is stored. However, the difference in voltage levels between the precharged bit line and the 0 may result in the node storing a 0 being pulled up towards 1 resulting in instability in the bit cell and the bit cell flipping value. This is called read disturb and can happen to a cell during a read to a cell or during a write to another cell on the same word line. In the latter case the word line is activated to access the cell being written to, which affects other cells connected to the word line.

One way of improving read and write performance is by effecting changes on the wordline signal, the bitline signal or a column power source. Increasing the voltage on the wordline slowly in response to a data access request allows the voltage level on non-driven bitlines to decay due to bitline leakage and column effects and to discharge due to the bitcell pulling down on the bitline if a 0 was stored thus resisting at least to some extent the charge injection from the precharged bitline through the pass gate which is slowly being turned on. The theory is that the bitcell pulldown should be stronger than the weak pass gate that is injecting charge as soon as its gate is turned on by the signal on the wordline. This decreases the chances of the charge on the bitlines being sufficient to flip a cell that is not being written to, but it delays the data access and therefore lowers performance.

It would be desirable to be able to reduce both read and write failures of a semiconductor memory without unduly affecting performance.

SUMMARY

A first aspect of the present invention provides a semiconductor memory storage device for storing data comprising:

a plurality of storage cells for storing said data each storage cell comprising an access control device configured to provide said storage cell with access to or isolation from a data access port in response to an access control signal;

access control circuitry configured to transmit said access control signal along one of a plurality of access control lines to control a plurality of said access control devices connected to said one of said plurality of access control lines;

said access control circuitry comprising:

access switching circuitry configured to connect a selected access control line to a voltage source for supplying a predetermined access voltage level;

feedback circuitry configured to feedback a change in voltage on said access control line to said access switching circuitry; wherein said access control circuitry is configured to respond to a data access request signal to access a selected storage cell connected to a corresponding selected access control line to:

control said access switching circuitry to provide a low impedance connection between said voltage source and said access control line such that a voltage level on said access control line changes towards said predetermined access voltage level at a first rate; and in response to said feedback circuitry providing a feedback signal indicating that said access control line voltage has attained a predetermined value to control said access control switching circuitry to provide a higher impedance connection between said voltage source and said access control line such that a voltage level on said access control line changes towards said predetermined access voltage level at a second rate said second rate being slower than said first rate.

The present technique recognises that controlling the voltage level on the word line can control the speed at which a storage cell is accessed and also the likelihood of an access disturb on a half selected cell occurring. It also recognises that the initial rise of the word line and voltage to the threshold voltage of the access device of the storage cell can safely be performed quickly while the access device is still off, however further rises in the word line voltage will start to turn the access device on and if this occurs too close to the start of the access cycle the charge on the data access port of half selected storage cells may be large enough to disturb the cell. Thus, it may be advantageous at this point to reduce the rate of increase of voltage on the access control line in order to delay the access to the cell. However, providing an additional control signal to do this or using delay elements to provide the control signal increases the cost of the cell and introduces possible sources of error.

The present technique recognises that the voltage level on the access control line is the determining factor when deciding when the rate of change of voltage level should be slowed and thus, if this were to be used as a feedback signal it could provide a convenient and useful signal for controlling this change without the need for an external control signal or delay circuitry. The invention addresses this by controlling the impedance of the connection of the access control line to the voltage source and thereby controlling the rate of change of the voltage level on the access control line in dependence upon a feedback signal of the change of voltage level on the access control line.

In some embodiments, said access switching circuitry comprises higher impedance switching circuitry and lower impedance switching circuitry, said access control circuitry being configured to switch both said higher impedance switching circuitry and said lower impedance switching circuitry on in response to said data access request signal and to switch said lower impedance switching circuitry off in response to said feedback signal indicating said voltage level on said access control line has attained said predetermined value.

A convenient way of implementing this control is to provide two switching circuits, one that has a higher impedance and the other a lower impedance. At the start of the data access cycle both switching circuits are on and then in response to the feedback signal indicating that the voltage level on the access control line has reached the predetermined level at which the rate should be slowed, the lower impedance switching circuitry is switched off. By providing two sets of impedance circuitry and switching them both on initially and later switching the lower impedance circuitry off a dip on the voltage level on the access control line is avoided. This dip would occur if, rather than switching both initially on, only the low impedance circuitry is switched on and is then later switched off when the high impedance circuitry is switched on.

In some embodiments, said predetermined value is substantially equal to a threshold voltage level of said access control devices at which said access control devices turn on and start to provide said storage cell with access to said data access port.

As noted previously prior to the access control devices switching on the data access port is not connected to the data storage cell and thus, no access disturbs can occur. Thus, the rise to this voltage level is fast. However, at this point the access control device starts to switch on and the data access port may start to discharge and therefore the switching process be slowed. If the predetermined value is substantially equal to a threshold voltage level of the access control device this is a convenient point to switch the rate of change of voltage level such that it slows at this point. It should be noted that later in the data access cycle, where the data access is a write, a voltage boost to the access control line may be applied to improve the yield of the write if this is required.

In some embodiments, said feedback circuitry comprises a switching device for generating said feedback signal, said switching device being of a same type as said access control devices and having substantially a same threshold voltage, said switching device switching output value in response to said voltage level on said access control line exceeding said threshold voltage of said switching device, said switch in output value indicating to said access control switching circuitry to provide a higher impedance connection between said voltage source and said access control line.

The feedback circuitry may take a number of forms, but in some embodiments it comprises a feedback switching device that has substantially a same threshold voltage as the access control devices and thus, will switch when the voltage level on the access control line reaches the threshold voltage of the access control devices. This switch can be used as the control signal to provide the higher impedance connection between the voltage source and the access control line. In this way a simple feedback circuit is provided that provides a change in the rate of change of voltage level on the access control line at the appropriate point. Furthermore, as it is formed on the same chip as the access devices global variations on the chip do not affect the accuracy of the level at which it switches, although local variations will have an effect. In some embodiments the feedback switching device has a threshold voltage that is similar to, but slightly lower than the threshold voltage of the access control device. This means that it would switch slightly earlier than the access control device. If the values were selected carefully this early switching could be used to compensate for delays in the feedback signal.

In some embodiments, said switching device is of a same type and between 1.5 and 5 times wider than said access control devices.

The switching device should be of the same type and have a similar threshold voltage to the access control device, however although it may be the same size, in some embodiments it is advantageous if it is wider. This is because it is important that the feedback occurs quickly and thus, a wide device with a low impedance will transmit the feedback signal more quickly and provide a device with a fast response to detecting that the voltage level on the access control line has attained the predetermined value.

In some embodiments, said access control devices comprise NMOS transistors; and
said switching device of said feedback circuitry comprises an inverter, said inverter comprising an NMOS and PMOS transistor arranged in series between a high voltage source and a low voltage source, said NMOS transistor being connected to said low voltage source and said PMOS to said high voltage source, said switching device switching to output an inverted value of an input signal in response to an input value attaining a threshold voltage of said NMOS transistor.

Although the access control devices of the data storage cells may be formed in a number of ways, in some embodiments they comprise NMOS transistors. In such a case, a convenient way of implementing the feedback switching device is as an inverter, the inverter comprising an NMOS and PMOS transistor arranged in series, the NMOS transistor having the same threshold voltage as the NMOS transistor of the access control device.

In some embodiments, said access control circuitry comprises a first logic gate for combining a clock signal and said data access request to generate a first control signal and a second logic gate for combining said control signal and said feedback signal to generate a second control signal, said higher impedance switching circuitry being controlled by said first control signal and said lower impedance switching circuitry being controlled by said second control signal.

Logic gates may be used to generate the control signals for controlling the higher impedance switching circuitry and the lower impedance switching circuitry. The first control signal that controls the higher impedance switching circuitry is generated by combining the clock signal and the data access request while the second control signal that controls the lower impedance switching circuitry is generated from a combination of this first control signal and the feedback signal. The logic gates are arranged such that the first control signal switching causes both the higher impedance circuitry to switch on and the second control signal to switch value which in turn causes the lower impedance circuitry to switch on. The feedback signal switching value causes the second control signal to switch again which causes the lower impedance signal to be switched off.

Although the semiconductor memory storage device may be made out of a number of different devices, for example planar transistors, in some embodiments it is formed from finfET transistors. FinFET transistors have smaller threshold voltage variations than planar devices and therefore, embodiments of the present invention work particularly well for semiconductor memory storage devices formed in this way as it is easy to replicate the threshold voltage of the access devices in an accurate manner and therefore provide accurate control of these access control devices.

In some embodiments, said feedback circuitry is formed of low threshold voltage devices.

Although there is a technical prejudice not to form semiconductor memory storage devices from low threshold devices as they will tend to consume higher power and have higher leakage, it is preferable in embodiments of the present invention that the feedback signal travels very quickly and therefore, it is advantageous if the feedback circuitry is formed of low threshold voltage devices as this produces a semiconductor memory storage device with a higher performance and with a safeguard for variations in the devices that in effect negates any overhead delay of the feedback circuit.

Although the semiconductor memory storage device may be formed in a number of ways, in some embodiments said plurality of storage cells are arranged in at least one array comprising a plurality of rows, a corresponding plurality of access control lines, a plurality of columns and a corresponding plurality of data lines and complementary data lines, each of said storage cells comprising two access control devices for controlling access to said data line and said complementary data line.

A convenient way of forming semiconductor memory storage devices is in arrays where access to a storage cell is controlled by an access control line that will control access to a row of storage cells.

Furthermore, this technique is particularly applicable to SRAM memories, although it can be used for other semiconductor memory storage devices.

In some embodiments, said higher impedance switching circuitry comprises a narrow transistor and said lower impedance circuitry comprising a wide transistor, said wide transistor being between 3 and 7 times wider than said narrow transistor.

A convenient way of forming the switching circuitry is to use transistors. To provide the difference in impedance wider and narrower transistors are used. It should be noted, that the higher impedance switching circuitry may have an impedance of between three and seven times that of the lower impedance circuitry.

Example widths of the narrow and wide transistors are between 1 and 3 microns and 6 and 9 microns, in some embodiments the lower transistor may be 1.5 microns with the wider transistor being for example 6 microns.

A second aspect of the present invention provides a method of storing data in a semiconductor memory storage device, said semiconductor memory storage device comprising a plurality of storage cells for storing said data, each storage cell comprising an access control device for providing said storage cell with access to or isolation from a data access port in response to an access control signal, wherein said method comprises the steps of:

receiving a data access request;

in response to said data access request:

using access switching circuitry to provide a low impedance connection between a selected access control line and a voltage source for supplying a predetermined access voltage level such that a voltage level on said access control line changes towards said predetermined access voltage level at a first rate;

feeding back a change in voltage on said access control line to said access switching circuitry;

in response to said fed back change in voltage indicating that said access control line voltage has attained a predetermined value controlling said access control switching circuitry to provide a higher impedance connection between said voltage source and said access control line such that a voltage level on said access control line changes towards said predetermined access voltage level at a second rate said second rate being slower than said first rate.

A third aspect of the present invention provides a semiconductor memory storage means for storing data comprising:

a plurality of storage cells for storing said data each storage cell comprising an access control device means for providing said storage cell with access to or isolation from a data access port in response to an access control signal;

access control means for transmitting said access control signal along one of a plurality of access control lines to control a plurality of said access control devices connected to said one of said plurality of access control lines;

said access control means comprising:

access switching means for connecting a selected access control line to a voltage source for supplying a predetermined access voltage level;

feedback means for feeding back a change in voltage on said access control line to said access switching circuitry; wherein said access control means is responsive to a data access request signal to access a selected storage cell connected to a corresponding selected access control line to:

control said access switching means to provide a low impedance connection between said voltage source and said access control line such that a voltage level on said access control line changes towards said predetermined access voltage level at a first rate; and is responsive to said feedback means providing a feedback signal indicating that said access control line voltage has attained a predetermined value to control said access control switching circuitry to provide a higher impedance connection between said voltage source and said access control line such that a voltage level on said access control line changes towards said predetermined access voltage level at a second rate said second rate being slower than said first rate.

The above, and other objects, features and advantages of this invention will be apparent from the following detailed description of illustrative embodiments which is to be read in connection with the accompanying drawings.

DESCRIPTION OF THE EXAMPLE NON-LIMITING EMBODIMENTS

Figure 1A:
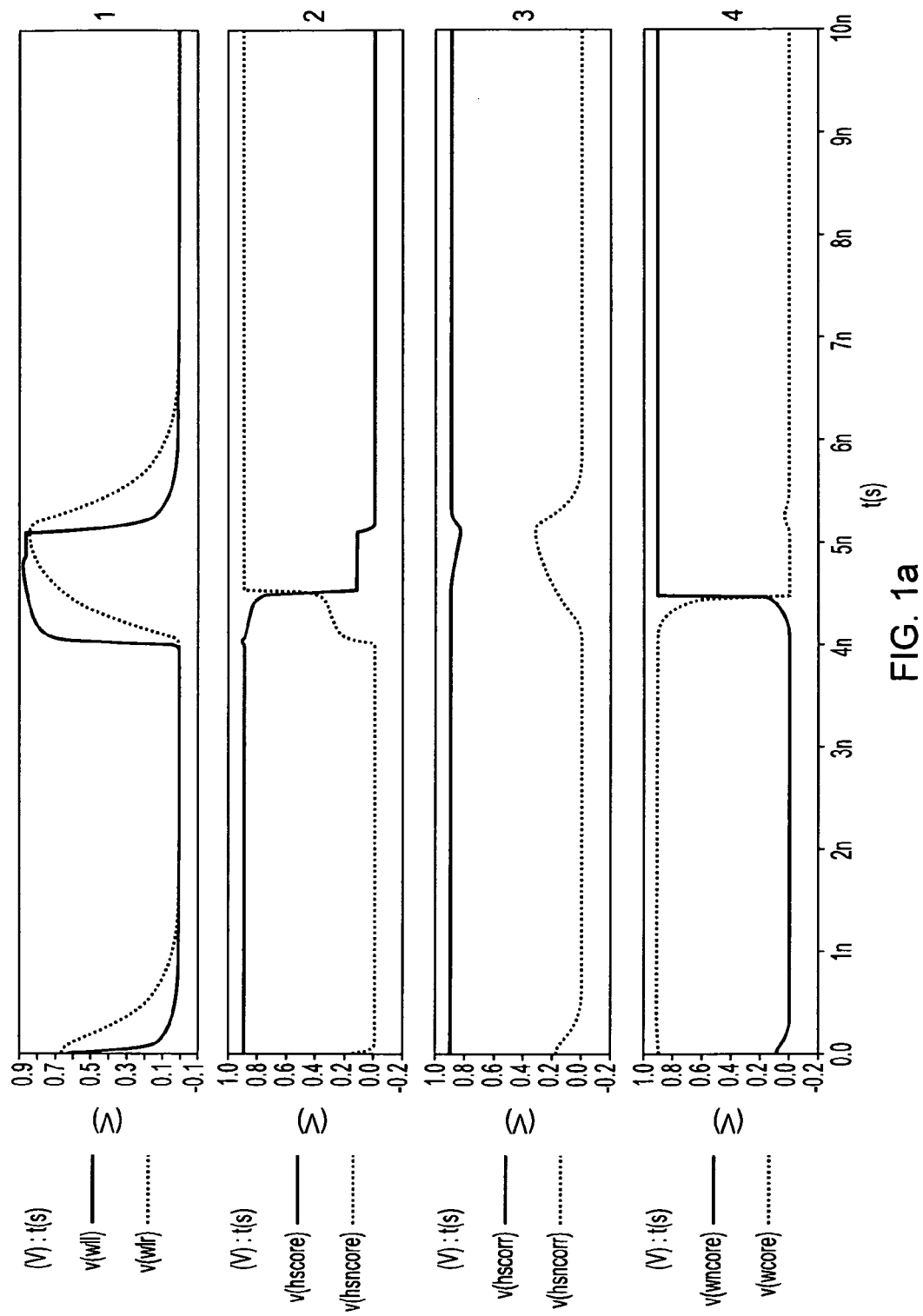
FIGS. 1a-1c show variations of voltage against time on a word line of cells in an SRAM memory and the change of voltage on the internal nodes of that memory indicating whether the value has switched or not.

FIG. 1a shows in graph 1 how the voltage level on the word line may increase either very quickly in a strong rectangular type shape or more slowly. If it increases very quickly then a disturb of a cell that is not being written to is likely as is shown in graph 2, where the values on the internal nodes of the storage cells flip values. Graph 2 shows the cells that are close to the wordline driver and therefore see a steep increase in voltage. Graph 3 shows cells that are further from the driver and thus, see a less steep curve and have fewer disturbs.

Graph 3 shows what happens to a non-written cell when the word line voltage increase is slower. In this case there is no read disturb, the voltage at the nodes being pulled away from their original values but returning to them. However, as can be seen the changes to voltage level at the internal nodes occur later in the cycle reflecting the slower change in voltage on the word line, thus such a change in voltage on the word line would have a delay associated with it. Thus, there is a yield increase associated with the slower rise in voltage level but there is also a performance cost.

Graph 4 shows a selected cell being written to. Both waveforms would write to the cell, but the write would be slower for the slower rising word line signal.

Figure 1B:
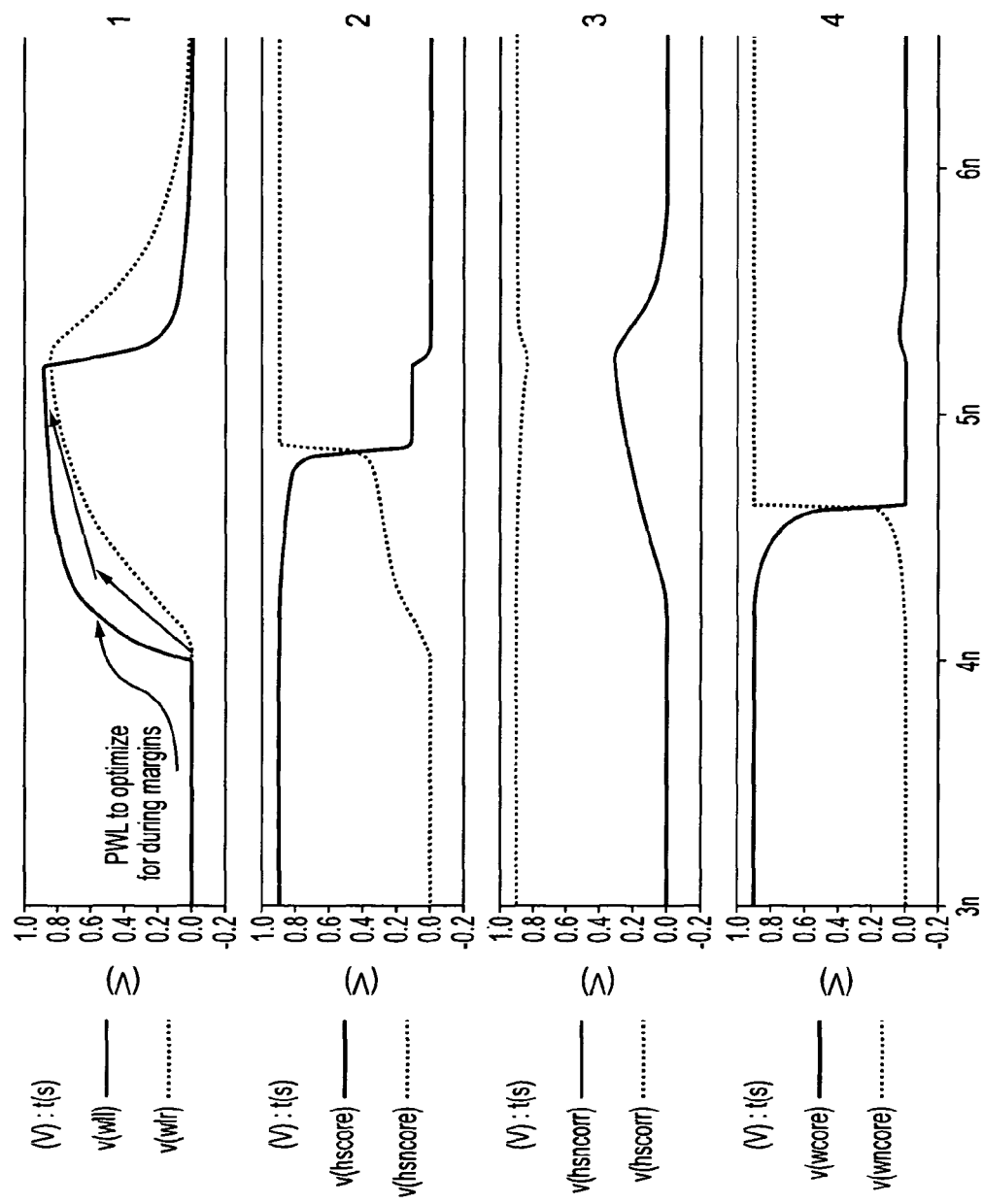

FIG. 1b shows a further word line variation which lies between the two examples given in FIG. 1a. The change in word line voltage of this intermediate example increases in two stages such that up to a certain value close to the threshold voltage of the pass gates of a bit cell in a memory it increases quite quickly while beyond to that the voltage level rise slows up. Up to the voltage threshold of the pass gates the pass gates are off and therefore any charge sharing between the cell and bit line is low. Once the pass gate starts to turn on there is some charge sharing between the bit cell and the bit lines and in order to prevent an access disturb occurring to half selected bit cells the pass gates should not be turned on too quickly. Thus, it is convenient if the slope of the increase of the voltage on the word line slows down at this point. In this way the yield is increased and yet the drop in performance is reduced. Once the pass gates are fully on then a boost may be provided if a write is being made such that there is a later increase on the voltage level not shown here which improves the yield of the write. This does not disturb a read as at this point the bit line is discharged significantly for the half selected cells where the bit line is not being driven such that the bit cell will not be disturbed by this increase in voltage on the word line. In this way the delay to access the cell can be reduced compared to the slower rising word line voltage while disturbs to the cells can be avoided or at least reduced.

It should be noted that where a word line is long then the bit cells located further from the word line driver will receive the increase in voltage level later and at a lower increase rate than those closer to the word line driver. Thus, it is the bit cells closer to the word line driver that are more likely to be disturbed. It is therefore these bit cells that the rate of change of voltage beyond the threshold voltage of the pass gate should be designed for.

It should also be noted that in memories that have many rows and therefore long bit lines the capacitance on the bit lines is high and therefore, the chances of an access disturb in half selected cells is higher. Thus, when designing the rate of change of voltage in the later half of the access cycle, factors such as the size of the memory and in particular the length of the bit lines need to be taken into consideration.

Figure 1C:
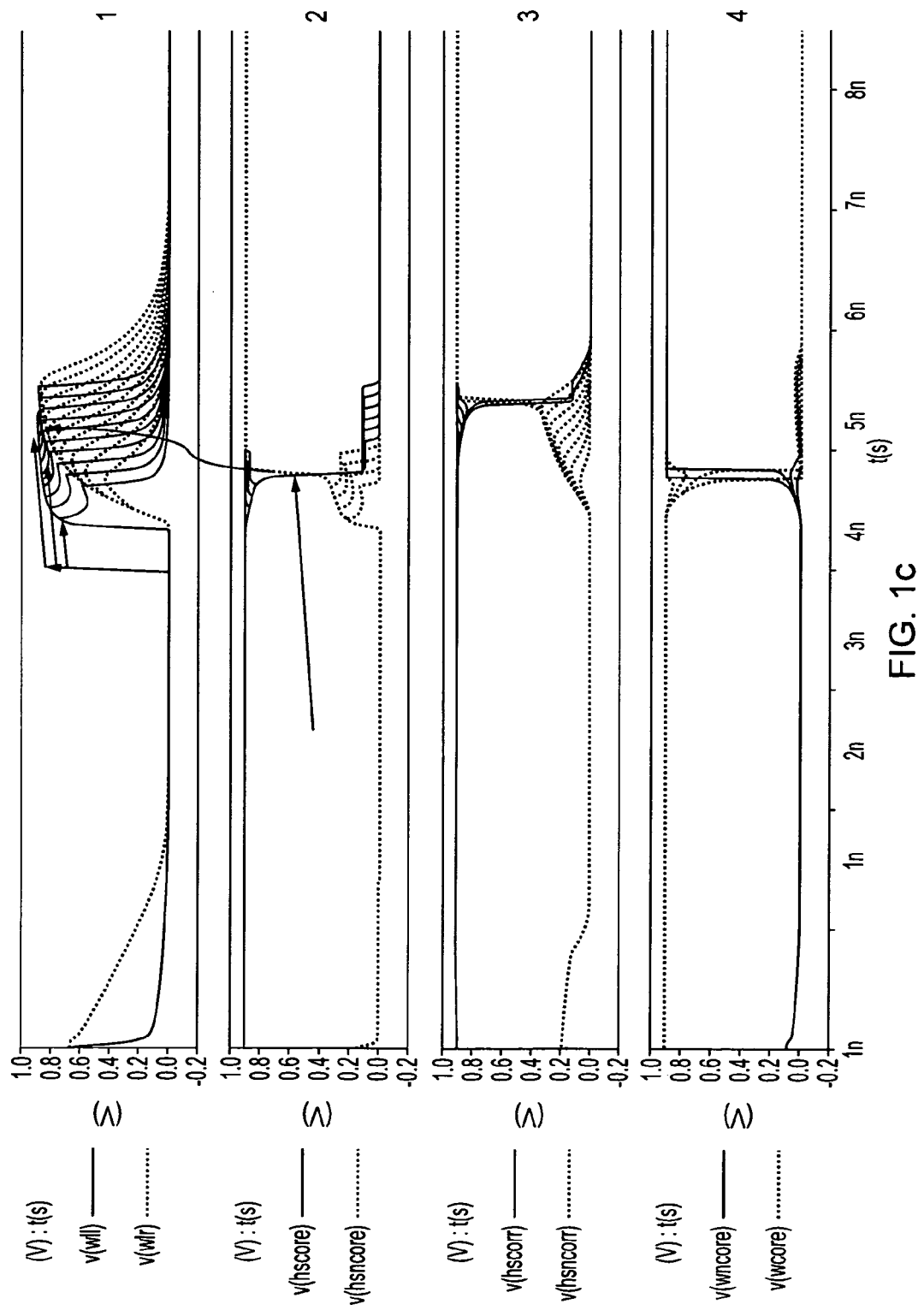

FIG. 1C graph 1 shows the change of voltage on the word line at different bit cells along the word line for both a fast increasing voltage and a slower increasing voltage. The further a bit cell is from the driver the greater the delay in the rise of the voltage level. Graph 2 shows the change in voltage level of the bit cells and shows a disturb for some of the bit cells where others are not disturbed. Graph 3 shows the change in voltage level at the internal nodes of the bit cells where the voltage rise on the word line is slower. In this case there is a delay in the changes of the voltage but again there are some although fewer cells that are disturbed. Graph 4 shows a successful write. In summary the design of an effective wordline driver depends on catching a good threshold voltage with the feedback while balancing RC loading with your performance requirements.

Figure 2:
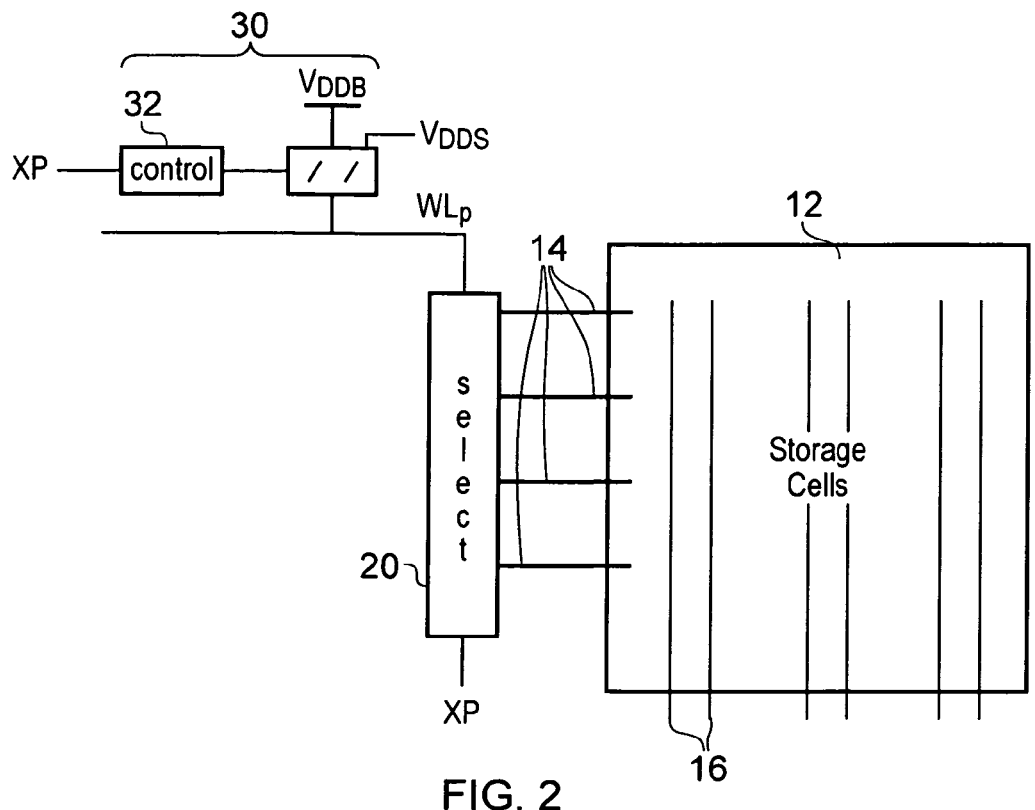
FIG. 2 schematically shows a semiconductor memory storage device according to an embodiment of the present invention.

FIG. 2 schematically shows a semiconductor memory storage device according to an embodiment of the present invention. There is an array of storage cells shown schematically as 12 and these are accessed under control of a plurality of word lines 14. The data is read out from the storage cells via bit lines 16.

Depending on the address of the data access request XP a particular word line 14 is selected using selection circuitry 20. The voltage level on this selected word line is then controlled using access control circuitry 30 that comprises control circuitry 32 and switching circuitry 34. The data access request is input to the control circuitry 32 and this controls switching circuitry 34 to provide a connection between the high voltage lines VDDB and VDDS and the selected word line WL. A feedback signal that feeds back the change in voltage level on the word line WL to control circuitry 32 is provided and the control circuitry determines when this feedback signal reaches a predetermined voltage level and in response to this it indicates to the switching circuitry that a higher impedance connection is to be provided between the voltage sources and the word line WL such that the rate of increase of the voltage level on the word line WL is slowed. This provides the two step ramp formation that is shown in FIG. 1.

Figure 3:
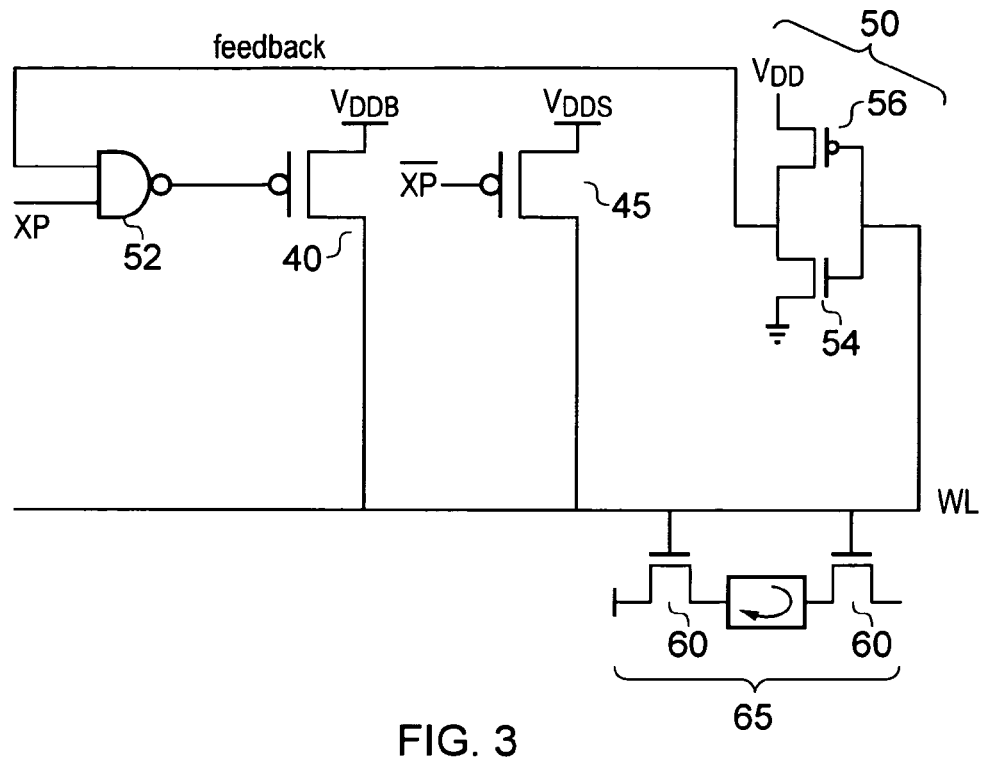
FIG. 3 shows the access control circuitry of a semiconductor memory control device according to an embodiment of the present invention.

The access control circuitry 30 for a simple embodiment is shown schematically in FIG. 3. There is a word line WL and the voltage on this word line is controlled by two switching devices 40 and 45. Switching device 40 is a large PMOS transistor which has a low impedance while 45 is a smaller PMOS transistor with a higher impedance. In this embodiment larger switching device 40 provides a connection to a voltage line VDDB while the smaller switching device 45 provides a connection to a voltage line VDDS. In other embodiments the switching devices may provide a connection to a same voltage line. The two voltage lines VDDB and VDDS are powered by different power supplies. They may provide the same maximum voltage level VDD or in some cases a different maximum voltage level, and they may have different capacities. The capacity of the power supply affects the rate of rise of voltage level as does the impedance of the switching devices. Thus, the use of different power supplies provides an additional level of control for the voltage level rise.

Initially in response to the data access request both switching devices 40 and 45 switched on and the word line rises to VDDB. This signal is fed back via inverter 50 to NAND gate 52 which also receives the data access request signal XP and controls the to larger transistor 40. Inverter 50 is formed of a PMOS transistor 56 and an NMOS transistor 54. The NMOS transistor 54 is of the same type as the NMOS transistors 60 which form the pass gates of the storage cells in the array. A single storage cell is shown schematically as 65. Thus, when the threshold voltage of the NMOS transistor 54 is reached the transistor will turn on and the PMOS transistor 56 will turn off and a 0 will be output by the feedback loop. This will cause a 1 to be output by NAND gate 52 and this will turn off the larger transistor 40 and thus, only the smaller higher impedance device 45 will provide a connection between VDDS and the word line. This will reduce the rate of increase of the voltage on the word line.

It should be noted that in preferred embodiments the inverter 50 is formed of low voltage threshold devices such that the feedback signal is sent quickly to NAND gate 52. Furthermore, although NMOS transistor 54 is designed to have the same threshold voltage as pass gate 60, it may be sized to be larger to again increase the speed at which the feedback signal is sent back to NAND gate 52.

Figure 4:
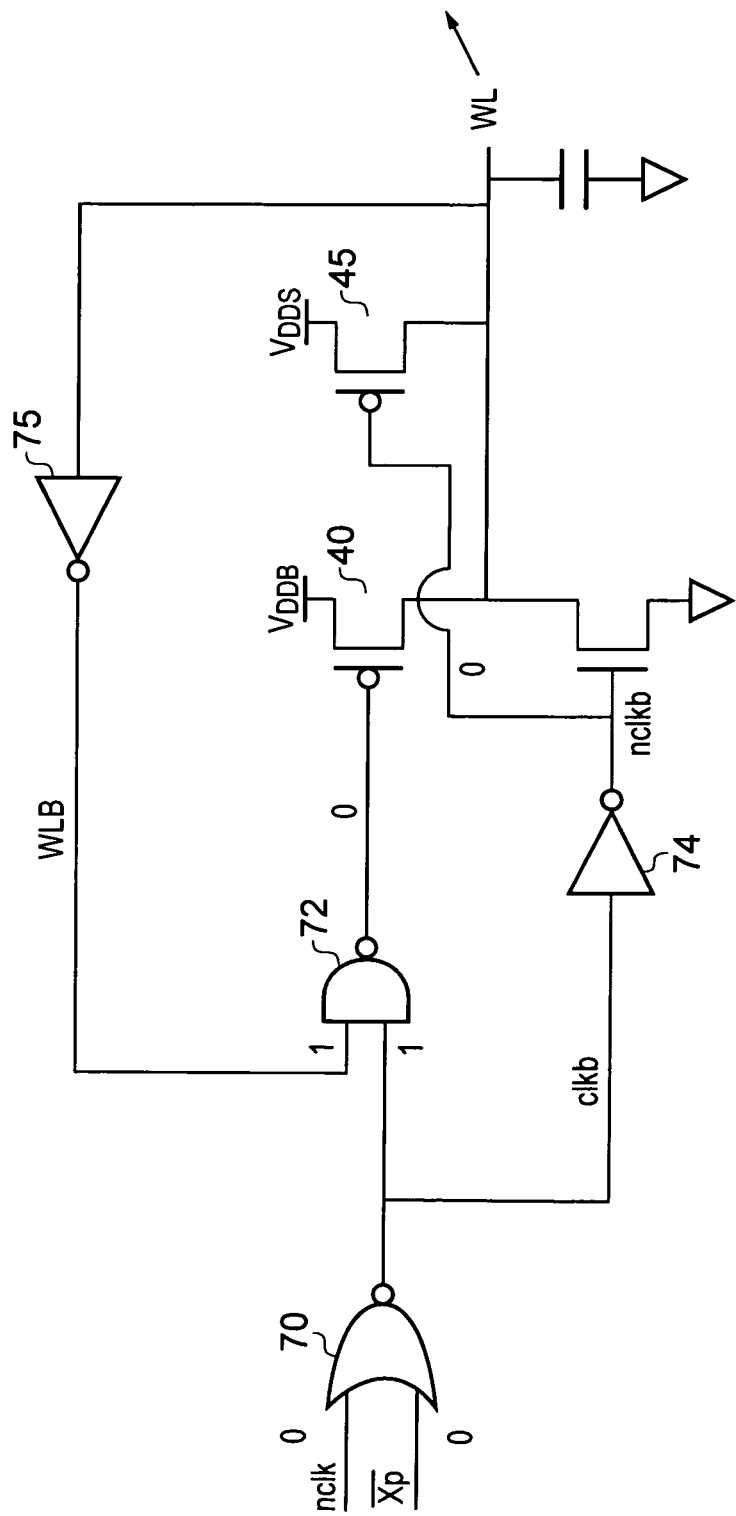
FIG. 4 shows an alternative embodiment of an access control device according to an embodiment of the present invention.

FIG. 4 shows an example of access control circuitry according to an embodiment of the present invention in the form of logic gates. In this embodiment, the memory is part of a synchronous system and thus, there is a clock signal that is input along with the inverted data access control signal XP. In response to the clock signal and the inverted data access control signal XP both being low, NOR gate 70 will output a 1 which while the word line is low will cause NAND gate 72 to output a 0 and inverter 74 to output a 0 and thus, both of switching circuits 40 and 45 are switched on. 40 is the larger lower impedance device while 45 is a smaller higher impedance device. At this point, the voltage on the word line start to rise.

This signal is sent back to NAND gate 72 via inverter 75 and when it reaches the threshold voltage of the inverter 75 it will switch to a 0 at which point NAND gate 72 will output a 1 and the larger transistor 40 will be switched off. There will then be only the smaller transistor 45 that connects the word line to the high voltage source and thus, the rate of change of voltage level on the word line will slow down.

Figure 5:
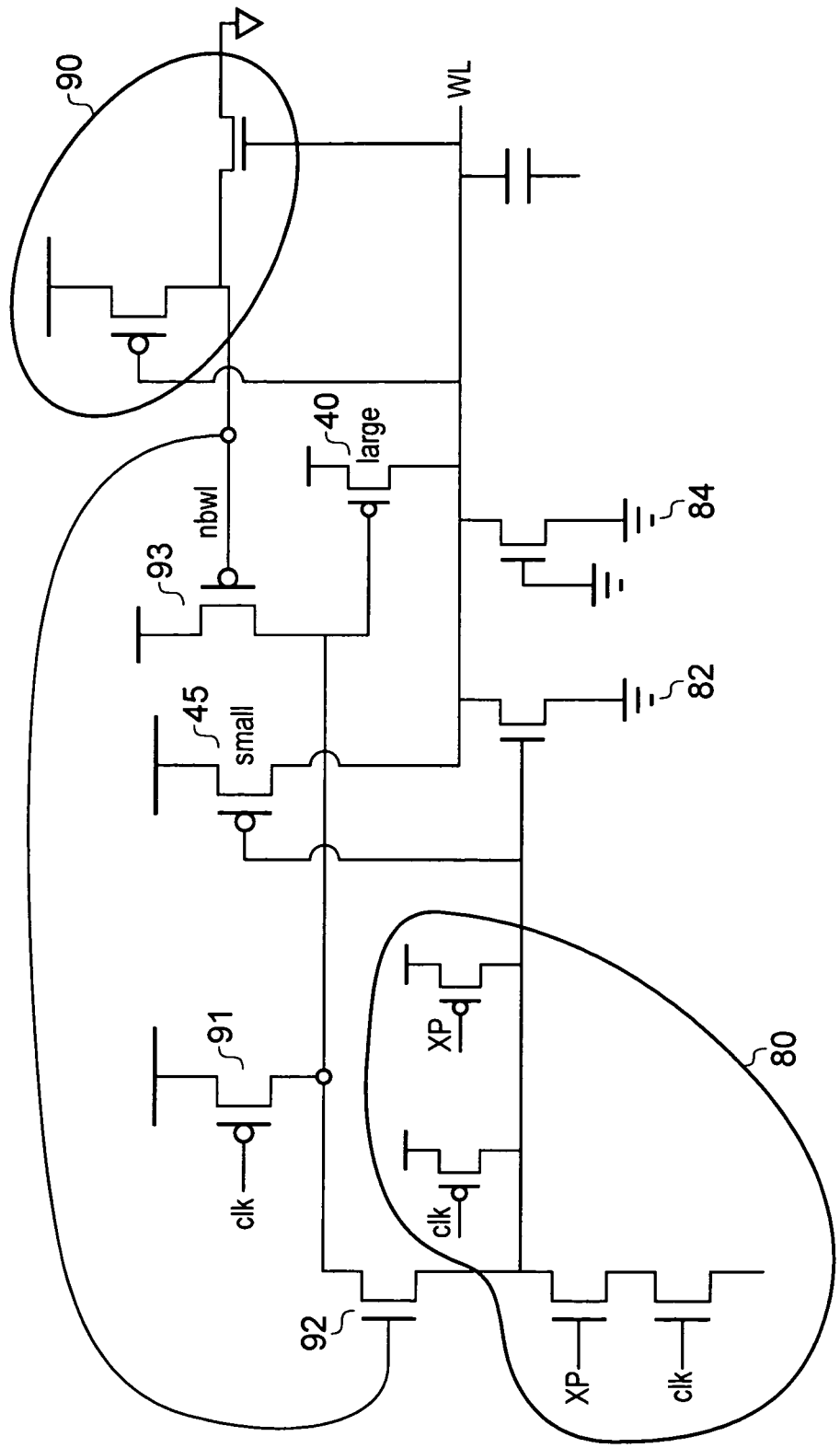
FIG. 5 shows a further embodiment of access control circuitry according to an embodiment of the present invention.

FIG. 5 shows an implementation of the access control circuitry in the form of transistors. Once again there is a word line WL with the voltage level on this controlled by a large PMOS transistor 40 and a small PMOS transistor 45. Initially in response to the data access signal XP and the clock signal they are both switched on by the output of the driver circuit 80. As the voltage level on the word line rises the feedback circuitry formed of inverter 90 and PMOS transistor 93 will cause PMOS transistor 93 to switch on which will raise the voltage level on the gate of the large transistor 40 and switch it off at which point the small transistor 45 will be controlling the rise in voltage level on the word line WL which will therefore be slow. Feedback also turns off NMOS 92 which disconnects the large PMOS gate 40 from the enable circuitry of 80.

In this embodiment there is an NMOS device 82 to pull the wordline WL down and not allow it to float when there is no access and a further NMOS device 84 that in this case is turned off but may have its gate connected to the feedback loop to provide an additional option to slow down the rise on the word line if this is required.

PMOS transistor 91 is controlled by the clock signal and provides a known state for the system at power up before the word line rises for the first time. Normally the word line should power up low since it is large and has a large capacitance on it, but in small memories it may couple with power and pull up high, this should be avoided and this small transistor 91 does this.

Figure 6:
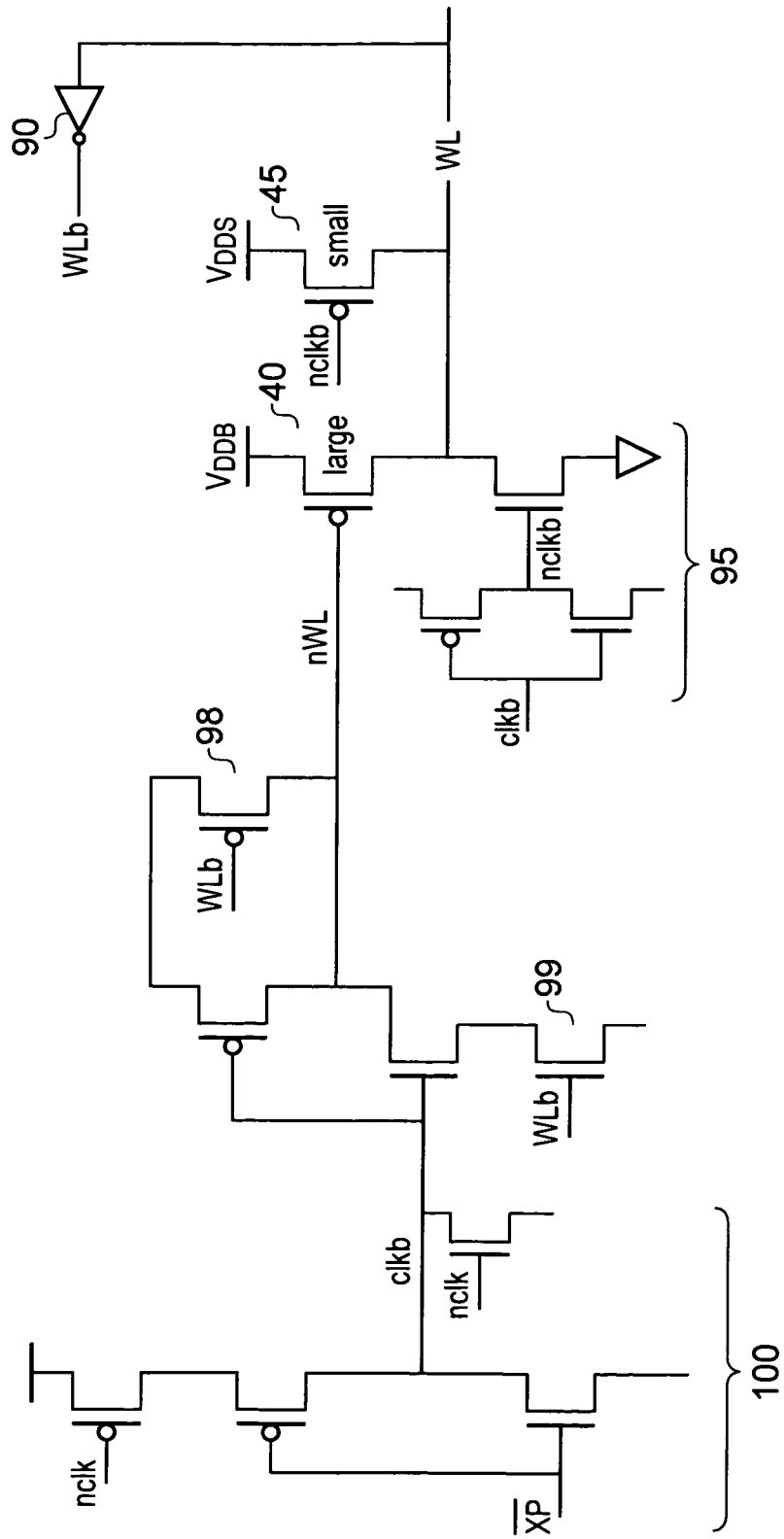
FIG. 6 shows a further embodiment of access control circuitry according to an embodiment of the present invention.

FIG. 6 shows an alternative embodiment of access control circuitry according to an embodiment of the present invention where there is again a small PMOS transistor 45 and a large PMOS transistor 40 that control the connection between the high voltage line and the word line. There is also circuitry 95 which pulls the word line down on the non-access portion of the clock cycle.

An inverter 90 provides a feedback signal to control circuitry which controls large transistor 40. This control circuitry consists of PMOS transistor 98 and NMOS transistor 99. The PMOS transistor 98 is switched on in response to the word line rising above the threshold voltage of inverter 90 while transistor 99 is switched off. This provides a 1 at the input to the large transistor 40 and turns it off. At this point the small transistor 45 is controlling the word line voltage. The devices 100 on the left of the figure are the devices which receive the clocking signal and the data access signal and provide the initial signal to turn both the large and the small transistors 40 and 45 on. These will operate to turn these transistors off at the end of the data access cycle.

Figure 7:
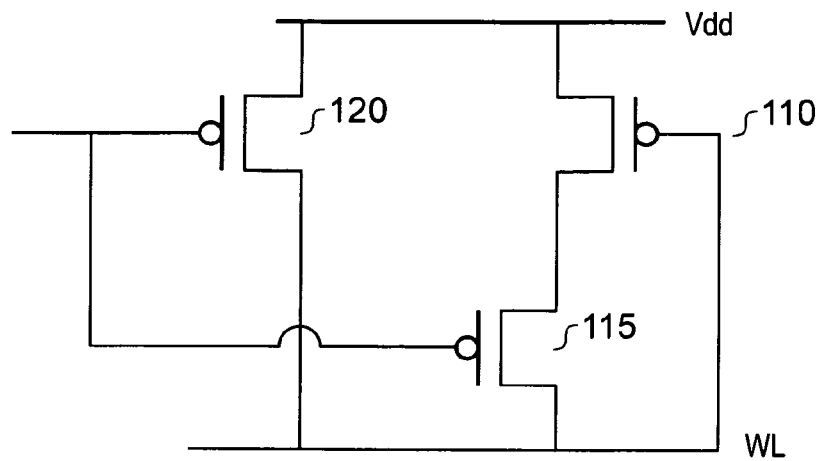
FIG. 7 shows an alternative embodiment for controlling the voltage level of a word line.

FIG. 7 shows schematically a section of a further embodiment of a word line control and feedback circuit wherein a low impedance path through transistor 110 and 115 is closed when PMOS transistor 110 turns off. This occurs when the word line voltage rises to the threshold voltage of this device. If the threshold voltage of the PMOS transistor 110 is selected to be close to the threshold voltage of the access devices of the bit cells, then as they start to turn on the rise in voltage level on the word line will slow as the low impedance path through transistors 110 and 115 is closed and the voltage rise on the word line is controlled by the path through transistor 120. It should be noted that this relies on the threshold voltage of the PMOS device which may not match or track that of an NMOS device. The access devices of the bit cell are usually formed of NMOS devices.

A disadvantage of this device is it uses stacked devices 110 and 115 which means more area will be required to implement the required word line driver.

Figure 8:
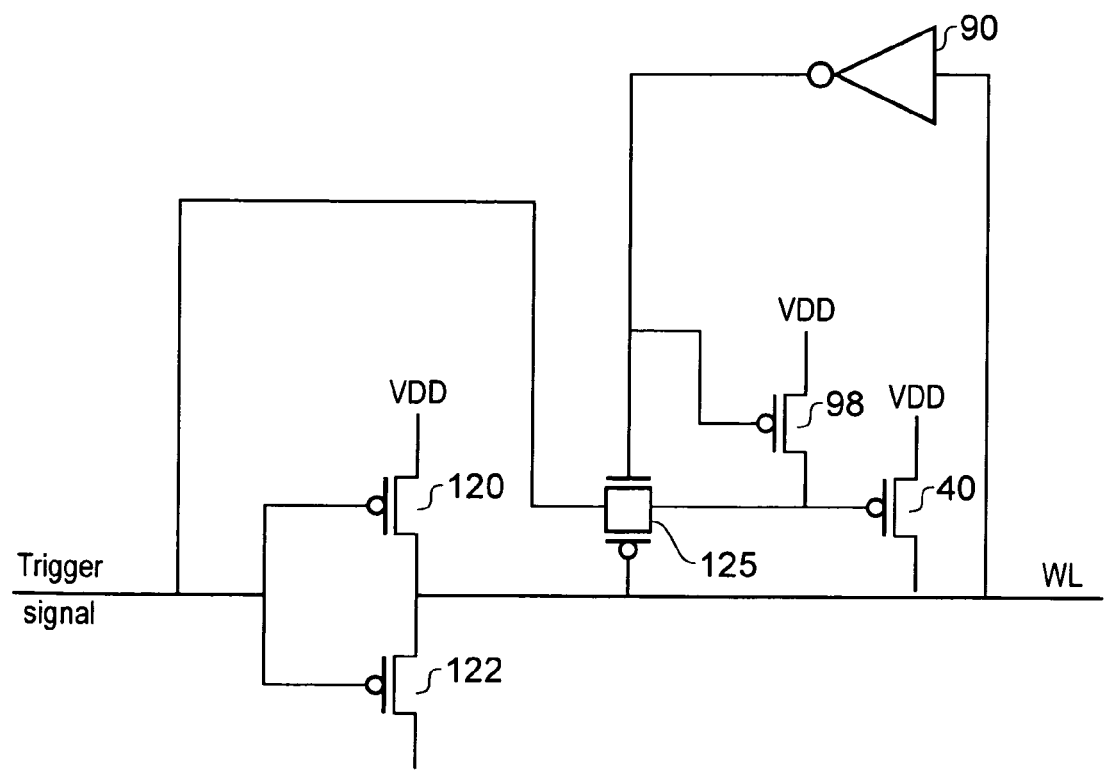
FIG. 8 shows an alternative word line control and feedback circuit.

FIG. 8 shows an alternative embodiment similar to that of FIGS. 5 and 6 but where the PMOS connected to the clock signal (91 of FIG. 5) is moved to the trigger signal and the word line. Thus, PMOS transistor 120 and NMOS transistor 122 are controlled by a trigger signal and either connect the word line to VDD or to ground, such that it does not float. In response to the trigger signal going low, pass gate 125 transmits the low signal to large PMOS transistor 40 which turns on while the trigger signal turns transistor 120 on and transistor 122 off. Thus, the voltage on the word line starts to rise. Inverter 90 provides a feedback signal which when the word line voltage rises to the threshold voltage of the inverter 90 sends a low signal which closes pass gate 125 and turns PMOS 98 on, and large PMOS 40 off. Thus, the rate of increase of the word line voltage slows when the threshold voltage of the inverter is reached.

An advantage of this arrangement is the very low transistor count. Furthermore, if inverter 90 is changed to a NAND gate, a disable pin can be added which could prevent the feedback in circumstances where it was not desirable to slow the rate of rise of voltage level on the word line. However, the pass gate 125 may have some negative effect on charge sharing and extra load on the word line signal.

Figure 9:
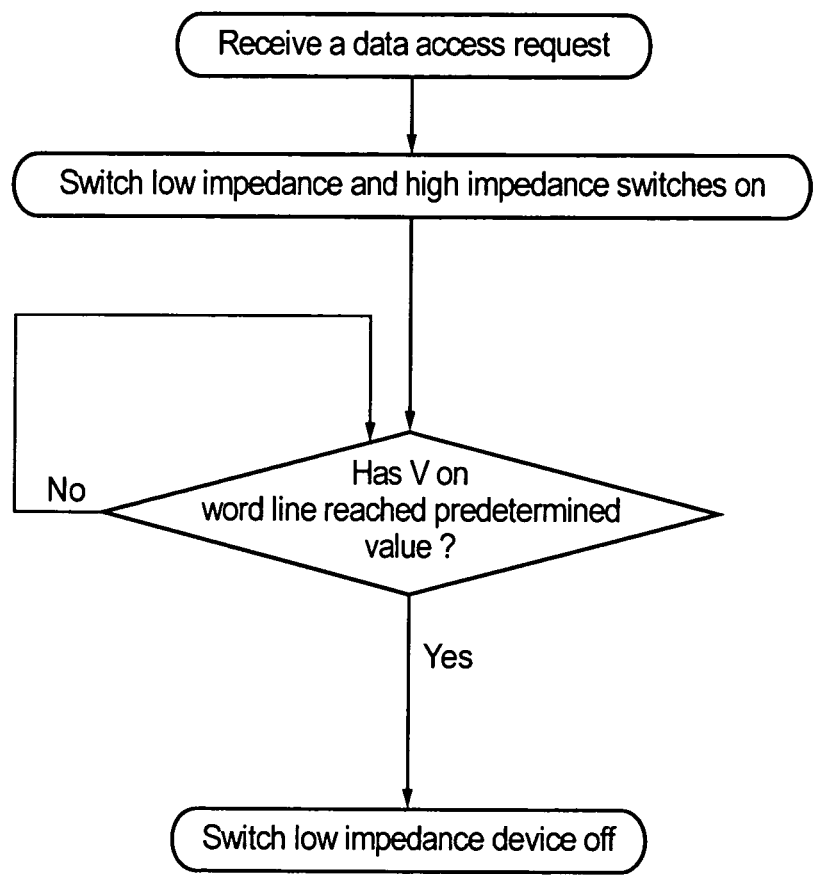
FIG. 9 shows a flow diagram illustrating steps in a method according to an embodiment of the present invention.

FIG. 9 shows a flow diagram indicating steps in a method according to an embodiment of the present invention.

Initially a data access request is received and this triggers data access to the memory. Low impedance and a high impedance switches are turned on to provide a connection between the selected word line indicated by the address of the data access request and the high voltage rails.

Feedback circuitry then determines whether the voltage on the word line has reached a predetermined value or not. Once it has reached a predetermined value then the low impedance device is turned off such that there is only a high impedance connection between the word line and one of the high voltage rails which slows down the rate of increase of the voltage level on the word line. In some embodiments a suitable impedance for the high impedance device can be selected in conjunction with the power supply for the voltage rail that it connects to the word line, a higher impedance device being selected in conjunction with a higher level voltage rail.

The embodiments illustrated are applicable to a memory with NMOS pass gates that is responsive to a high signal on the word line. It will be clear to a skilled person that inverse logic could be used with a memory having PMOS pass gates and a low voltage level on the word line triggering an access.

The transistors used in the circuits of the figures may be planar transistors, or alternatively they could be finFET transistors. The latter transistors have very low variants on threshold voltage which makes them particularly suitable for embodiments of the present invention. In this regard, the feedback circuitry is designed to mimic the threshold voltage on the pass gates of the storage cells. If the pass gates all have very similar threshold voltage levels and if this can be mimicked accurately then the memory can be designed to have higher performance as lower margins in the design can be used to attain correct behaviour.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. A semiconductor memory storage device for storing data comprising:
    a plurality of storage cells for storing said data each storage cell comprising an access control device configured to provide said storage cell with access to or isolation from a data access port in response to an access control signal;
    access control circuitry configured to transmit said access control signal along one of a plurality of access control lines to control a plurality of said access control devices connected to said one of said plurality of access control lines;
    said access control circuitry comprising:
        access switching circuitry configured to connect a selected access control line to a voltage source for supplying a predetermined access voltage level;
        feedback circuitry configured to feedback a change in voltage on said access control line to said access switching circuitry; wherein
    said access control circuitry is configured to respond to a data access request signal to access a selected storage cell connected to a corresponding selected access control line to:
    control said access switching circuitry to provide a low impedance connection between said voltage source and said access control line such that a voltage level on said access control line changes towards said predetermined access voltage level at a first rate; and
    in response to said feedback circuitry providing a feedback signal indicating that said access control line voltage has attained a predetermined value to control said access control switching circuitry to provide a higher impedance connection between said voltage source and said access control line such that a voltage level on said access control line changes towards said predetermined access voltage level at a second rate said second rate being slower than said first rate;
    wherein said feedback circuitry comprises a switching device for generating said feedback signal, said switching device being of a same type as said access control devices and having substantially a same threshold voltage, said switching device switching an output value in response to said voltage level on said access control line exceeding said threshold voltage of said switching device, said switch in the output value indicating to said access control switching circuitry to provide the higher impedance connection between said voltage source and said access control line.

2. A semiconductor memory storage device according to claim 1, wherein
    said access switching circuitry comprises higher impedance switching circuitry and lower impedance switching circuitry, said access control circuitry being configured to switch both said higher impedance switching circuitry and said lower impedance switching circuitry on in response to said data access request signal and to switch said lower impedance switching circuitry off in response to said feedback signal indicating said voltage level on said access control line has attained said predetermined value.

3. A semiconductor memory storage device according to claim 1, wherein said predetermined value is substantially equal to a threshold voltage level of said access control devices at which said access control devices turn on and start to provide said storage cell with access to said data access port.

4. A semiconductor memory storage device according to claim 1, wherein said switching device is of a same type and between 1.5 and 5 times wider than said access control devices.

5. A semiconductor memory storage device according to claim 1, wherein
    said access switching circuitry comprises higher impedance switching circuitry and lower impedance switching circuitry, said access control circuitry being configured to switch both said higher impedance switching circuitry and said lower impedance switching circuitry on in response to said data access request signal and to switch said lower impedance switching circuitry off in response to said feedback signal switching value.

6. A semiconductor memory storage device according to claim 1, wherein
    said access control devices comprise NMOS transistors; and
    said switching device of said feedback circuitry comprises an inverter, said inverter comprising an NMOS and PMOS transistor arranged in series between a high voltage source and a low voltage source, said NMOS transistor being connected to said low voltage surce and said PMOS to said high voltage source, said switching device switching to output an inverted value of an input signal in response to an input value attaining a threshold voltage of said NMOS transistor.

7. A semiconductor memory storage device according to claim 1, wherein said semiconductor memory storage device is formed from finFET transistors.

8. A semiconductor memory storage device according to claim 1, wherein said feedback circuitry is formed of low threshold voltage devices.

9. A semiconductor memory storage device according to claim 1, wherein said plurality of storage cells are arranged in at least one array comprising a plurality of rows, a corresponding plurality of access control lines, a plurality of columns and a corresponding plurality of data lines and complementary data lines, each of said storage cells comprising two access control devices for controlling access to said data line and said complementary data line.

10. A semiconductor memory storage device according to claim 9, wherein said array of storage cells comprises an SRAM memory.

11. A semiconductor memory storage device according to claim 1, wherein said higher impedance switching circuitry comprises a narrow transistor and said lower impedance circuitry comprising a wide transistor, said wide transistor being between 3 and 7 times wider than said narrow transistor.

12. A semiconductor memory device according to claim 11, wherein said narrow transistor is between 1 and 3 microns and said wide transistor is between 6 and 9 microns.

13. A semiconductor memory storage device for storing data comprising:
 a plurality of storage cells for storing said data each storage cell comprising an access control device configured to provide said storage cell with access to or isolation from a data access port in response to an access control signal;
 access control circuitry configured to transmit said access control signal along one of a plurality of access control lines to control a plurality of said access control devices connected to said one of said plurality of access control lines;
 said access control circuitry comprising:
  access switching circuitry configured to connect a selected access control line to a voltage source for supplying a predetermined access voltage level;
  feedback circuitry configured to feedback a change in voltage on said access control line to said access control line to said access switching circuitry; wherein
 said access control circuitry is configured to respond to a data access request signal to access a selected storage cell connected to a corresponding selected access control line to;
  control said access switching circuitry to provide a low impedance connection between said voltage source and said access control line such that a voltage level on said access control line changes towards said predetermined access voltage level at a first rate; and
 in response to said feedback circuitry providing a feedback signal indicating that said access control line voltage has attained a predetermined value to control said access control switching circuitry to provide a higher impedance connection between said voltage source and said access control line such that a voltage level on said access control line changes towards said predetermined access voltage level at a second rate said second rate being slower than said first rate;
  said access switching circuitry comprises higher impedance switching circuitry and lower impedance switching circuitry, said access control circuitry being configured to switch both said higher impedance switching circuitry and said lower impedance switching circuitry on in response to said data access request signal and to switch said lower impedance switching circuitry off in response to said feedback signal indicating said voltage level on said access control line has attained said determined value;
  wherein said access control circuitry comprises a first logic gate for combining a clock signal and said data access request to generate a first control signal and a second logic gate for combining said control signal and said feedback signal to generate a second control signal, said higher impedance switching circuitry being controlled by said first control signal and said lower impedance switching circuitry being controlled by said second control signal.

14. A method of storing data in a semiconductor memory storage device, said semiconductor memory storage device comprising a plurality of storage cells for storing said data, each storage cell comprising an access control device for providing said storage cell with access to or isolation from a data access port in response to an access control signal, wherein said method comprises the steps of:
 receiving a data access request;
 in response to said data access request:
  using access switching circuitry to provide a low impedance connection between a selected access control line and a voltage source for supplying a predetermined access voltage level such that a voltage level on said access control line changes towards said predetermined access voltage level at a first rate;
  feeding back a change in voltage on said access control line to said access switching circuitry;
  in response to said fed back change in voltage indicating that said access control line voltage has attained a predetermined value controlling said access control switching circuitry to provide a higher impedance connection between said voltage source and said access control line such that a voltage level on said access control line changes towards said predetermined access voltage level at a second rate said second rate being slower than said first rate;
 wherein said change in voltage is fed back to said access switching circuitry using a switching device of a same type as said access control devices and having substantially a same threshold voltage, said switching device switching an output value in response to said voltage level on said access control line exceeding said threshold voltage of said switching device, said switch in the output value indicating to said access switching circuitry to provide the higher impedance connection between said voltage source and said access control line.

15. A method according to claim 14, wherein said access switching circuitry comprises higher impedance switching circuitry and lower impedance switching circuitry, said step of providing said low impedance connection comprising switching both said higher impedance switching circuitry and said lower impedance switching circuitry on such that both provide said connection and said step of providing said higher impedance connection comprising switching said lower impedance switching circuitry off such that it no longer provides said connection.

16. A method according to claim 14, wherein said predetermined value is substantially equal to a threshold voltage level of said access control devices at which said access control devices turn on and start to provide said storage cell with access to said data access port.

17. A method according to claim 14, wherein said step of feeding back a change in voltage on said access control line to said access switching circuitry is performed using feedback circuitry, said feedback circuitry comprising a switching device of a same type as said access control devices and having substantially a same threshold voltage, said switching device switching output value in response to said voltage level on said access control line exceeding said threshold voltage of said switching device, said switch in output value triggering said step of providing a higher impedance connection between said voltage source and said access control line.

* * * * *